US006876224B2

United States Patent
Marshall et al.

(10) Patent No.: US 6,876,224 B2
(45) Date of Patent: Apr. 5, 2005

(54) METHOD AND APPARATUS FOR HIGH SPEED BUS HAVING ADJUSTABLE, SYMMETRICAL, EDGE-RATE CONTROLLED, WAVEFORMS

(75) Inventors: David John Marshall, Fort Collins, CO (US); Philip L. Barnes, Plano, TX (US); Larry Jay Thayer, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 72 days.

(21) Appl. No.: 10/288,174

(22) Filed: Nov. 5, 2002

(65) Prior Publication Data

US 2004/0085088 A1 May 6, 2004

(51) Int. Cl.[7] .............................................. H03K 17/16
(52) U.S. Cl. ............................ 326/22; 326/21; 326/26; 326/86
(58) Field of Search ............................... 326/21–30, 16, 326/86, 82, 83, 90; 327/108–112; 714/724–726; 710/100, 126

(56) References Cited

U.S. PATENT DOCUMENTS 6,198,307 B1 * 3/2001 Garlepp et al. ............... 326/83
6,272,577 B1 * 8/2001 Leung et al. ................ 710/110
6,288,563 B1 * 9/2001 Muljono et al. .............. 326/27
6,456,124 B1 * 9/2002 Lee et al. .................... 327/108
6,510,526 B1 * 1/2003 Schoenborn ................ 713/500

* cited by examiner

Primary Examiner—Vibol Tan

(57) ABSTRACT

A method of enhancing noise margin on digital signal lines of a system includes steps of evaluating impedances and lengths of the digital signal lines. Resonances of each digital signal line are determined, and target waveforms for each digital signal line optimized for noise margin are determined. A configuration is generated for a programmable device driver to configure the device driver to generate the waveform optimized for noise margin. An alternative embodiment selects waveforms, and corresponding configurations, from a group of possible waveforms at boot time to ensure that data is transferred with optimum noise margins. Also claimed is apparatus embodying bus drivers capable of driving a bus with a waveform approximating blended trapezoidal and sinusoidal edge shapes, this waveform being optimum for noise margin in certain systems having multidrop busses.

14 Claims, 5 Drawing Sheets

METHOD AND APPARATUS FOR HIGH SPEED BUS HAVING ADJUSTABLE, SYMMETRICAL, EDGE-RATE CONTROLLED, WAVEFORMS

FIELD OF THE INVENTION

The invention relates to apparatus for high speed bussing. In particular, the invention relates to tuning waveforms for high speed bussing to enhance signal integrity.

BACKGROUND OF THE INVENTION

Bussing is commonly used to interconnect various elements of a computer system. Typically each bus services two, three, or more devices. Single-ended bussing typically has a single set of data lines, one for each bit, with associated reference grounds, control, and power lines, all connecting to each device on the bus. Differential bussing typically has a differential pair of lines for each data bit, with associated reference grounds, differential pairs of control lines, and power lines, all connecting to each device on the bus.

Repetitive signals, including bus waveforms can be represented as a superposition of sine waves. A typical bus waveform has frequency components at a fundamental frequency equal to one-half the maximum transition rate of the bus, plus components at various harmonics of this frequency. Typical bus waveforms have significant energy in higher harmonics.

Common problems in bussing include reflections on, and crosstalk between, lines of a bus. Reflections and crosstalk can degrade the integrity of signals on the bus, leading to errors.

Typically, a bus line can be regarded as a transmission line carrying a signal. It is common to minimize reflections through termination resistors at each end of the bus. The magnitude of reflections at bus ends is a function of impedance matching between termination impedances to a characteristic impedance of the bus, and may be frequency dependent. Reflections may also arise from stub lines where devices tap into intermediate points along the bus, since stub lines are rarely terminated with termination resistors. The superposition of reflections on a bus is a function of frequency as well as the lengths of the stub and bus lines.

It is known that the lengths of the stub and bus lines cause resonances in the frequency response of the bus. This is because reflected signals have delay dependent upon these lengths. Reflected signals may reflect again from any point along the bus at which an impedance mismatch occurs. Each reflected, or re-reflected, signal has a particular phase relationship with respect to the original signal. Multiple delayed waveforms add or cancel at particular points along bus and stub according to the phase relationships of the original signal and each reflection or re-reflection present on the bus. These phase relationships are known to be a function of bus and stub lengths.

These resonances in bus performance may be very significant at particular harmonics of signals present on the bus, and much less significant at the next higher or lower harmonics.

Crosstalk is a consequence of mutual inductance and capacitance between near or adjacent bus lines. As such, crosstalk is strongly frequency dependent. In general, crosstalk tends to increase with increasing frequency since capacitive and inductive coupling increase with frequency.

Since reflections and crosstalk are frequency dependent, and can significantly degrade noise margin, it is desirable to minimize high frequency components of bus waveforms. Controlling particular high frequency components minimizes reflections along, and crosstalk between bus lines, thereby avoiding errors in a system.

Integrated circuit design and fabrication not only is very expensive, but design times are often much longer than system board design times. Integrated circuits may be used on multiple, somewhat different, system boards. Bus and stub lengths vary with system board design.

SUMMARY

A high-speed bussing system utilizes waveforms having controlled edge rates to minimize harmonics while maintaining rapid transitions. The waveforms have smoothed transitions, such that transitions from one level to another begin and end gradually. In a particular embodiment, rising and falling edge transitions are symmetrical.

A particular embodiment generates the smoothed waveforms through a piecewise-linear driver according to phased control signals.

In an embodiment, the piecewise linear driver is programmable. It is programmed to generate a waveform having particular piecewise-linear segment amplitudes and times chosen and sequenced according to segment amplitudes and times that minimize reflections and crosstalk in circuit simulations of bussing in a particular system.

In another embodiment, the piecewise linear driver is programmed dynamically, with amplitudes and times chosen to maximize noise margin in the system as determined from boot-time characterization of bus noise margins.

In an embodiment, symmetrical waveforms, derived from blending gated sinusoid and trapezoidal waveforms, are used for a multidrop bus. These waveforms approximate the equation $V=c*((n*a*t)+(b*\sin(nt))/(a+b)$ for a range of $-1/n<=t<=1/n$ centered on the transition, where a and b are blending constants, c an amplitude, and t is time.

DETAILED DESCRIPTION OF THE EMBODIMENTS

Figure 1A:
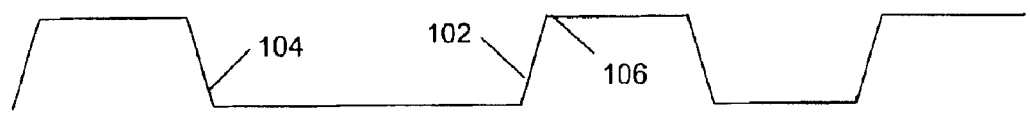
FIG. 1a is an illustration of waveforms of a typical CMOS bus with sharp edge transitions and plentiful harmonics.

A waveform (FIG. 1a) of a typical bus interconnecting CMOS (Complimentary Metal Oxide Semiconductor) integrated circuits has fairly steep rising 102 and falling 104 edges. The waveform has fairly sharp transitions 106 between rising or falling edges and stable high or low periods. These steep edges 102, 104 and sharp transitions 106 are characterized by considerable energy in high harmonics, such that reflections and crosstalk may occur.

Figure 1B:
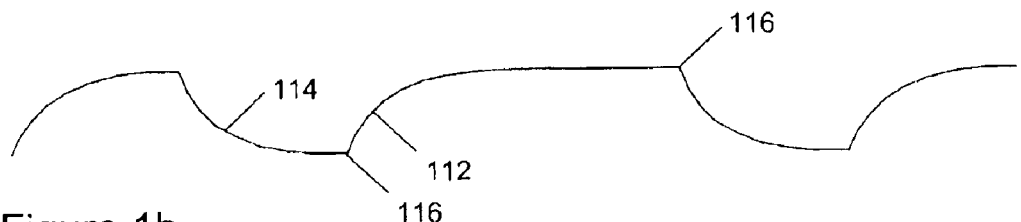
FIG. 1b, an illustration of waveforms of a typical ECL bus with exponential edge transitions.

A waveform (FIG. 1b) of a typical ECL (Emitter Coupled Logic) bus has relatively slow, exponential, rising 112 and falling 114 edges. The waveform also has fairly sharp transitions 116 between high or low periods and the rising 112 or falling 114 edges. The sharp transitions 116 have considerable energy in high harmonics, while the relatively slow edges 112, 114 are slower than desirable; the slow edges may even be slow enough to cause data synchronization problems in some systems where edge timing is significant.

It is therefore desired to use a bus waveform (FIG. 1c) having smoothed and controlled transitions 122, 124 between levels 130 and edges 126, and fast edge times.

Figure 2:
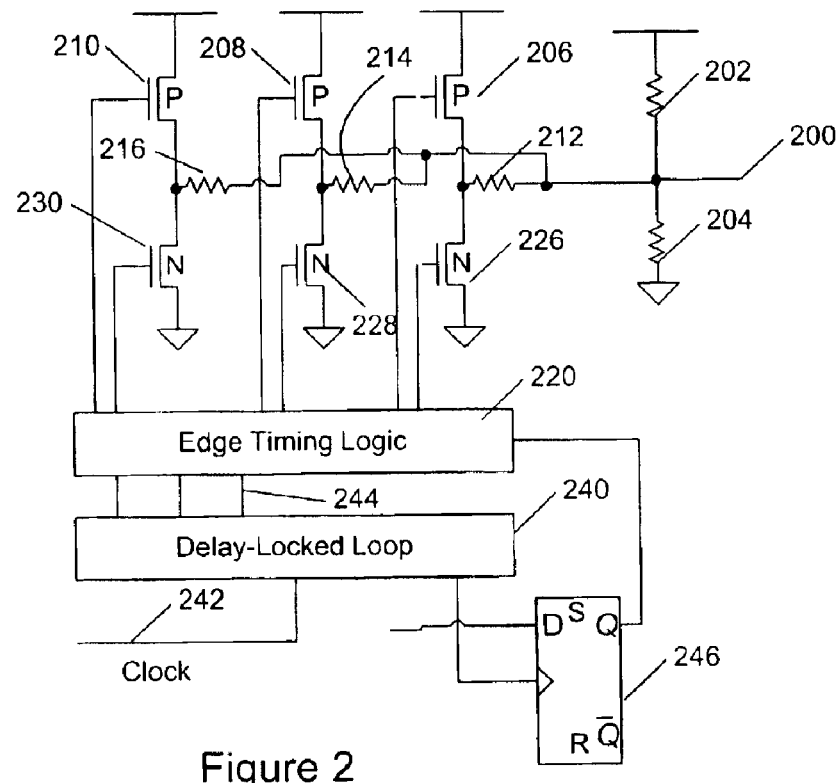
FIG. 2, a schematic of a driver capable of producing smoothed, programmable, bus transitions.

There are several embodiments of circuitry to generate a bus waveform having controlled transitions 122, 124. A particular embodiment generates the smoothed waveforms on an output 200 (FIG. 2) through a piecewise-linear driver driven by phased control signals. In this embodiment, there are termination resistors 202, 204.

Figure 1C:
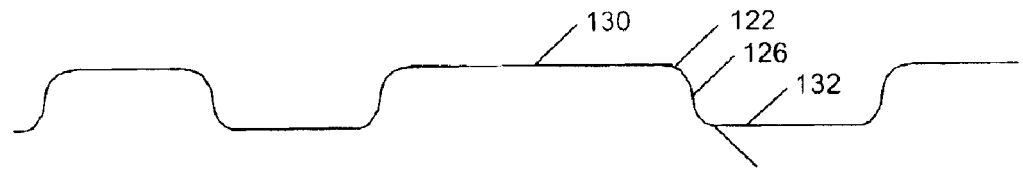
FIG. 1c, an illustration of waveforms with smoothed bus transitions.

Consider a steady-state logic high signal 130 (FIG. 1c). In this state, pullup transistors 206, 208, 210 (FIG. 2) are all "on", pulling output 200 up through resistors 212, 214, 216. Edge timing logic 220 is provided such that when a transition 122 to a falling edge 126 is generated, pullup transistors 206, 208, and 210 are successively turned off to generate a piecewise-linear approximation of a smoothed transition. Each transistor contributes a component to the output 200 determined by the ratio of its current-limiting resistor 212, 214, 216 to the impedance of termination resistors 202, 204. Current-limiting resistors 212, 214, 216 serve as current-controlling devices for segments of piecewise-linear output 200. As each transistor turns off, its contribution is removed from the sum at the output, reducing the output level. Load capacitance at output 200 further rounds the edge. When pullup transistors 206, 208, and 210 are all off, the complimentary pulldown transistors 226, 228, 230 are turned on in sequence. The steady-state low signal 132 is formed with all pullup transistors 206, 208, 210 "off", and all pulldown transistors 226, 228, 230 "on".

An alternate embodiment lacks termination resistors 202 and 204. In this embodiment, as each pullup transistor 206, 208, and 210 is turned off, its complementary pulldown transistor 226, 228, 230 is turned on. In this embodiment, there is no phase where all pullup and all pulldown transistors are turned off. In this embodiment, while three sets of pullup and pulldown transistors are illustrated, there may be three, four, or more, sets of pullup and pulldown transistors without departing from the spirit hereof; the more sets of pullup and pulldown transistors the more closely the generated waveform will approximate an ideal waveform.

In both embodiments, edge timing logic 220 may be controlled by one or more high-speed clocks. In a particular embodiment, a delay-locked loop 240 is used to generate a series of clock phases 244 from a reference clock 242. It is known that delay-locked loops on modern integrated circuits can divide gigahertz-range clock signals into phases offset by less than a tenth of a nanosecond. The delay-locked loop 240 may also generate a clock to a data-synchronization flip flop 246.

Both embodiments of the driver are therefore capable of outputting a piecewise-linear approximation of an output waveform having smoothed transitions from levels to edges. This output waveform has controlled harmonic content and therefore is controlled reflections and crosstalk.

Figure 3:
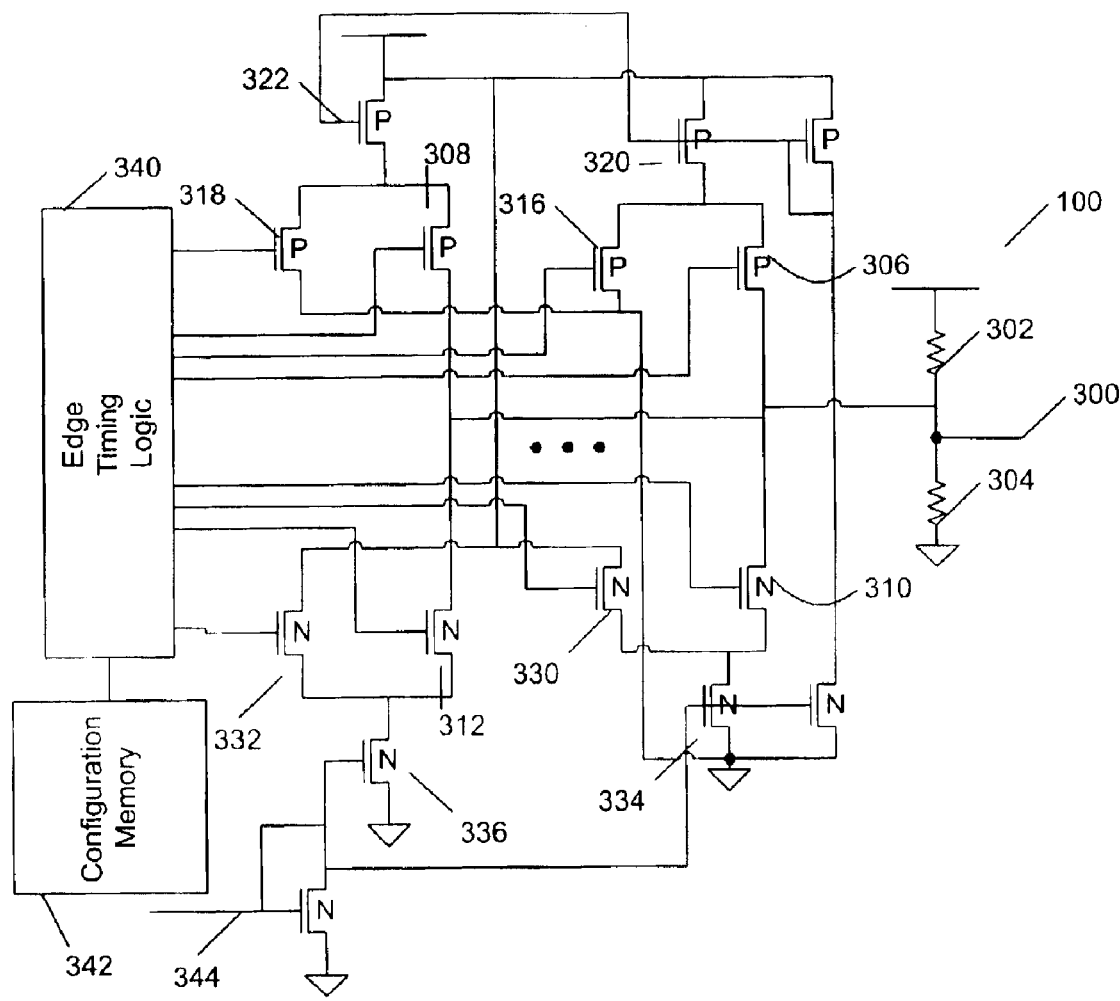
FIG. 3, a schematic of an alternate driver capable of producing smoothed, programmable, bus transitions.

In another embodiment, the symmetrical smoothed-transition waveforms of FIG. 1c are generated by steering and summing currents without current-limiting resistors 212, 214, 216. In this embodiment, output 300 (FIG. 3) is coupled to termination resistors 302, 304, and to two or more pullup current-steering transistors 306, 308, and two or more pulldown current-steering transistors 310, 312. Various implementations of this embodiment may have additional sets of current steering transistors without departing from the spirit hereof. A particular implementation of this embodiment has four sets each of pullup and pulldown current-steering transistors 306, 308, 310, 312.

Each pullup current-steering transistor 306, 308 is coupled in differential-amplifier configuration to complementary current-steering transistors 316, 318, and to current mirror transistors 320, 322. Current mirrors 320, 322 serve as current-controlling devices for segments of piecewise-linear transitions on the bus in this embodiment. Similarly, each pulldown current-steering transistor 310, 312 is coupled in differential-amplifier configuration to complementary current-steering transistors 330, 332, and to current mirrors 334, 336. Edge timing logic 340 controls the current steering and complimentary current steering transistors to sequence rising and falling transitions to synthesize a piecewise-linear approximation of a desired waveform.

Edge timing logic 340 of this embodiment has a configuration memory 342. Configuration memory 342 is programmed with sequence order and timing information for each transition. In this embodiment, configuration memory 342 is programmable such that the driver may be configured to produce transitions optimized for particular bus layouts. A reference current 344 controls relative currents of the current mirrors 320, 322.

In yet another alternate embodiment (not shown) for use with differential bussing, the complementary current-steering transistors 316, 318, 332, 330 are coupled to drive a complimentary output of the driver instead of the power or ground rails.

Figure 4:
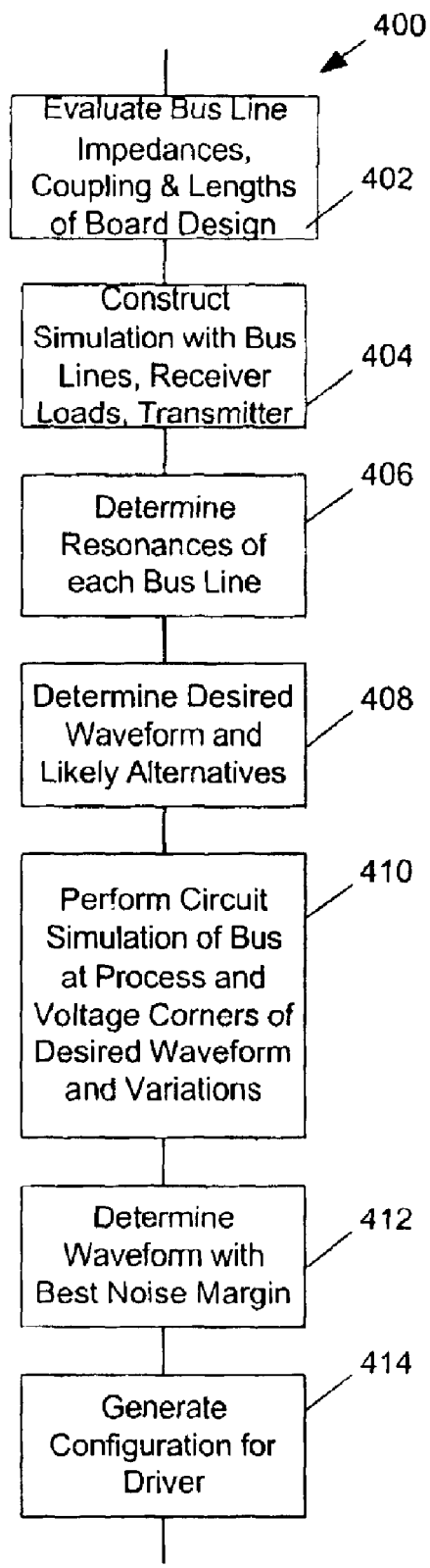
FIG. 4, a flowchart of a method for determining a configuration for a bus driver to maximize noise margin in a system.

A method 400 (FIG. 4) of designing a configuration for a bus driver begins with the step of evaluating 402 impedances and lengths of each line of the bus. Velocity factor may also be considered. From this information, plus impedances of loads on these signal lines, a circuit simulation of the bus lines, transmitter, and receivers is constructed 404. From this simulation, resonances of each digital signal line are also determined 406.

Once the resonances are determined 406, desired waveforms for each digital signal line can be determined 408 such that waveform harmonics at resonances are avoided; these waveforms are expected to be optimized for noise margin. In a particular embodiment, a number of alternative waveforms are also determined 408.

Circuit simulations are then performed 410 to determine bus response to each waveform, and bus noise margin is determined for each waveform simulated. The waveform of those simulated with best noise margin is determined 412. A configuration for programmable device drivers of the integrated circuit is then generated 414 to configure the driver to produce the waveform with the best noise margin. The generated configuration is loaded into the configuration memory 342 (FIG. 3) of device drivers of the integrated circuit to configure them to produce the optimum waveform.

In a particular embodiment, the configuration customized for a particular motherboard is stored in a boot EEPROM of the motherboard and is transferred into the configuration memory 342 at boot time.

Figure 5:
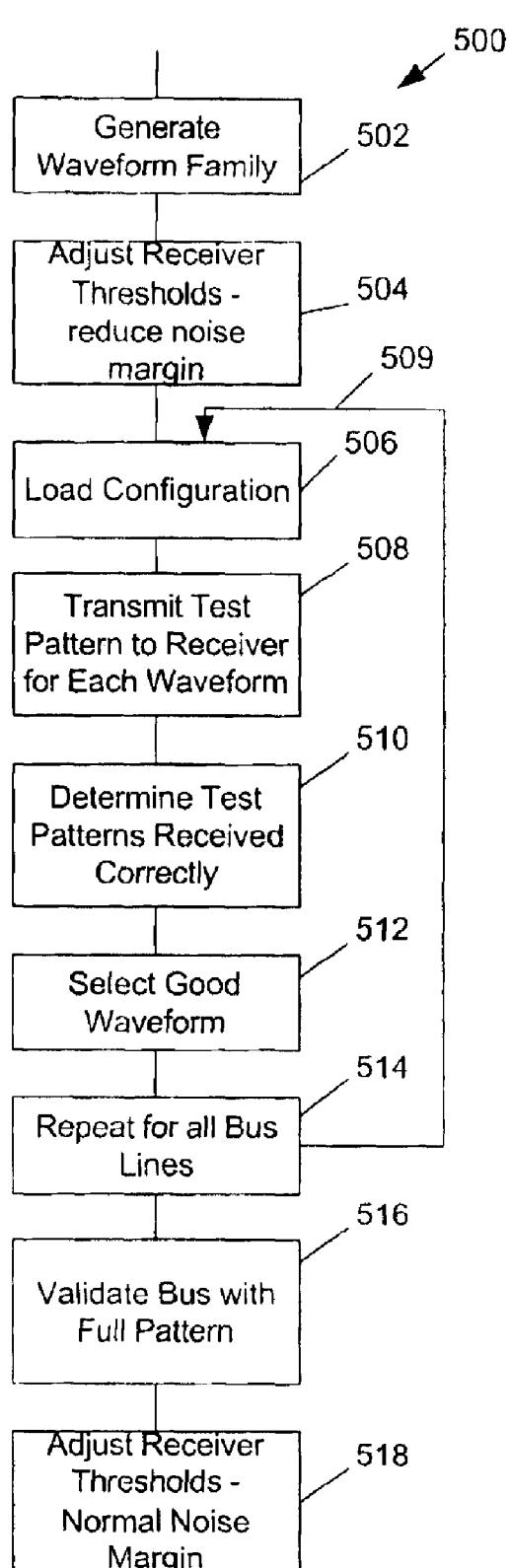
FIG. 5, a flowchart of a method operable in a system for determining a bus driver configuration to maximize noise margin.

In another embodiment of the method 500 (FIG. 5), operable in a system, waveforms are selected to maximize noise margin at boot time. In this embodiment, a family of waveforms is generated 502, such that each member of the family has different harmonics minimized; configurations for these waveforms may be generated and stored in the boot EEPROM.

At boot time, receiver thresholds are adjusted 504 to reduce noise margin. This is done by injecting offsets into each receiver. In a particular embodiment, test pattern transmission 508 and reception 510 steps of the method are repeated 509 for positive and negative offsets to ensure adequate noise margins. Configurations for each waveform of the family are successively loaded into the configuration memory 342 (FIG. 3) of device drivers of the integrated circuit and test patterns are transmitted 508 from the driver to each receiver on the bus. Each time a test pattern is transmitted, received data is checked to determine which test patterns are received correctly. A waveform of the waveform family that results in good data transfer is then selected 512.

The steps of loading configuration 506, transmitting test patterns 508, determining those test patterns received correctly 510, and picking a waveform 512 are repeated 514 for all bus lines.

After a waveform, and corresponding configuration, 512 is selected for each bus line, data transfer is validated 516 with a test pattern on the entire bus. Receiver thresholds are then readjusted 518 to normal levels and system boot continues.

Figure 10:
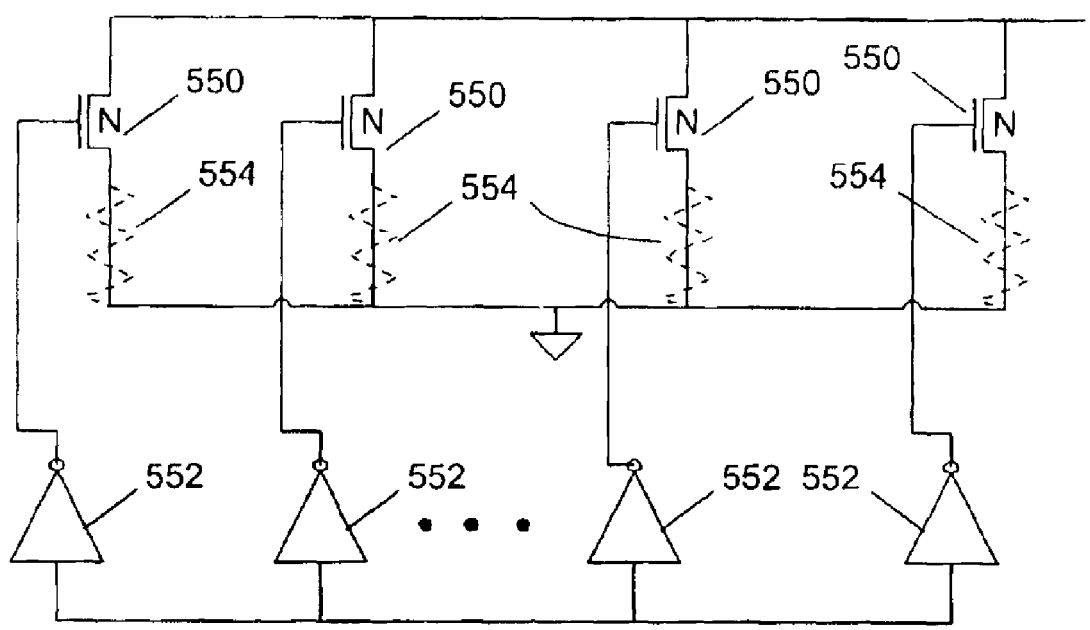
FIG. 10, a schematic of the pulldown half of a driver capable of generating edge waveforms determined by individual sizing of devices.

Once a particular edge-shape waveform has been determined as optimum for a particular system, it is anticipated that alternative drivers lacking runtime programmability may be used to generate the optimum waveform. These alternative drivers may, but need not, operate in piecewise-linear manner as heretofore described. A particular alternative driver has a plurality of carefully-sized pulldown transistors 550 (FIG. 10), each having individually-sized predriver inverters 552. Each predriver inverter 552 has rising and falling delay determined by its device sizes; pulldown transistors 550 therefore effectively turn on at times during an edge transition determined by these device sizes. Current limiting resistors 554 may optionally be placed in series with, and on either the drain or source side of, each pulldown transistor 550.

Figure 6:
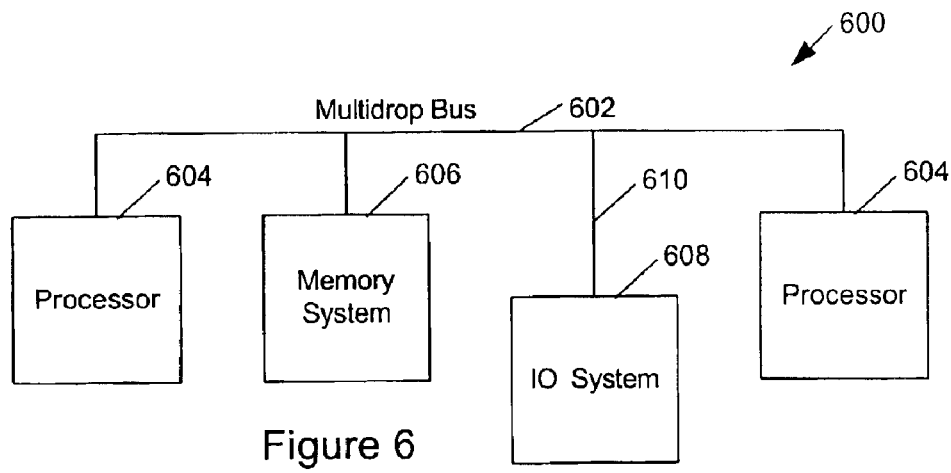
FIG. 6, a block diagram illustrating a computer system embodying a multidrop bus.
Figure 7:
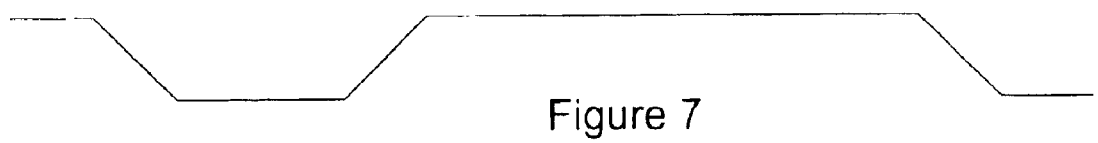
FIG. 7, an illustration of a trapezoidal waveform.
Figure 8:
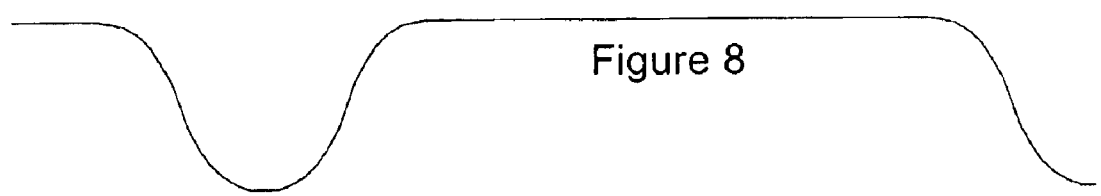
FIG. 8, a sketch of a gated sinusoidal waveform.
Figure 9:
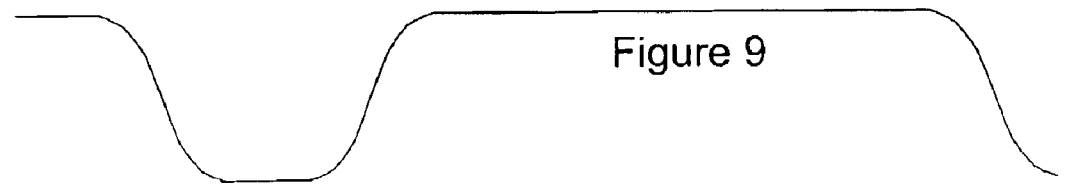
FIG. 9, a sketch of a waveform derived by blending gated sinusoid and trapezoidal waveforms.

In a particular embodiment, bus drivers as heretofore described are embodied in a computer system 600 (FIG. 6) having a multidrop bus 602, coupling multiple devices such as one or more processors 604 (which may include cache memory), system memory 606, and I/O devices 608, where stubs 610 may be of different lengths. It has been found that good bus performance can be attained by programming the drivers to generate waveforms that have edges that are a blend of trapezoidal (FIG. 7) and sinusoidal (FIG. 8) edge shapes. The resultant blended waveform (FIG. 9) approximates the equation $V=c*((n*a*t)+(b*\sin(nt))/(a+b)$ for t time between $-1/n$ and $1/n$ centered on the transition, where a and b are blending constants, c an amplitude, and n determines transition duration. In this embodiment, constants a, b, and n are determined in accordance with the methods heretofore discussed with reference to FIGS. 4 and 5. It is anticipated that constants a, b, and n are determined individually for each device on the bus.

It has been found that waveforms approximating this equation are particularly suited for use with multidrop busses because stub reflections and overall crosstalk can be optimized with these waveforms. The trapezoidal component determined by parameter a of this blended waveform minimizes crosstalk, especially crosstalk from capacitive coupling, through minimizing edge transition rates. The gated-sinusoid component determined by parameter b minimizes stub resonances when parameter n is chosen appropriately for the stub lengths and impedance mismatches of the bus. Parameters including the edge duration $1/n$ and gated-sinusoid/trapezoid ratio a/b may be tuned for each system design to produce a maximum noise margin for a given transition rate.

While the embodiments have been illustrated with CMOS transistors as known in the art, it is anticipated that other forms of transistors, including bipolar and heterojunction transistors fabricated in silicon or silicon-germanium processes, may be used in equivalent circuits.

It will be understood by those skilled in the art that various other changes in the form and details may be made without departing from the spirit and scope hereof. It is to be understood that various changes may be made in adapting to different embodiments without departing from scope hereof and comprehended by the claims that follow.

What is claimed is:

1. A method of enhancing noise margin on digital signal lines comprising the steps of:
    evaluating impedances and lengths of a plurality of digital signal lines;
    determining resonances of each of the digital signal lines;
    determining waveforms for each digital signal line optimized for noise margin; and
    generating a configuration for at least one programmable device driver to configure said device driver to generate at least one waveform optimized for noise margin.

2. The method of claim 1, wherein the waveforms determined in the step of determining waveforms comprise symmetrical segments of smoothed and superimposed sinusoidal and trapezoidal waveforms.

3. The method of claim 1 wherein the digital signal lines are lines of a bus having a plurality of lines, and wherein separate configurations are generated for a plurality of programmable device drivers.

4. The method of claim 1 wherein the step of determining waveforms further comprises the step of performing circuit simulations to determine noise margins available with at least one waveform.

5. The method of claim 4, wherein the at least one driver comprises a plurality of current-controlling devices for segments of piecewise-linear transitions and logic capable of sequencing segments during transitions.

6. The method of claim 5, wherein the logic capable of sequencing segments during transitions further comprises a memory.

7. An integrated circuit for use in a system, the integrated circuit comprising:
    bus drivers capable of driving a multidrop bus, the bus drivers further comprising means for driving lines of the multidrop bus with a waveform approximating a blend of trapezoidal and sinusoidal edge shapes,
    wherein the bus drivers are configurable to generate a plurality of waveforms.

8. The integrated circuit of claim 7, where the bus drivers are capable of driving at least one bus line with a signal having edge voltages approximating the equation $V=c*((n*a*t)+(b*\sin(nt)))/(a+b)$ for a range of $-1/n<=t<=1/n$ centered on the transition, where a and b are blending constants, c an amplitude, and t is time.

9. The integrated circuit of claim 7, wherein the integrated circuit further comprises means for selecting a particular waveform of the plurality of waveforms for use during system operation.

10. The integrated circuit of claim 9, wherein the particular waveform is selected to maximize noise margin at receivers coupled to the multidrop bus.

11. A bus driver for an integrated circuit capable of outputting a piecewise-linear approximation of an output waveform comprising:
   a plurality of current-controlling devices for segments of piecewise-linear transitions and
   logic capable of sequencing segments during transitions, the logic capable of sequencing segments during transitions further comprising a memory.

12. The bus driver of claim 11, wherein the logic capable of sequencing segments during transitions further comprises a delay-locked loop.

13. The bus driver of claim 11, wherein the memory of the logic capable of sequencing segments during transitions contains a configuration determined to control reflections for a particular bus configuration.

14. The bus driver of claim 13, wherein the configuration determined to control reflections for a particular bus configuration produces signal edges approximating a blend of trapezoidal and gated-sinusoidal edges.

* * * * *